(12) United States Patent
Yoshimura

(10) Patent No.: US 10,818,648 B2
(45) Date of Patent: Oct. 27, 2020

(54) SEMICONDUCTOR MODULE

(71) Applicant: Mitsubishi Electric Corporation, Tokyo (JP)

(72) Inventor: Kouichi Yoshimura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/405,019

(22) Filed: May 7, 2019

(65) Prior Publication Data
US 2020/0066697 A1 Feb. 27, 2020

(30) Foreign Application Priority Data

Aug. 24, 2018 (JP) .................................. 2018-157719

(51) Int. Cl.
| | | |
|---|---|---|
| H01L 33/00 | (2010.01) | |
| H01L 25/16 | (2006.01) | |
| H01L 49/02 | (2006.01) | |

(52) U.S. Cl.
CPC .......... *H01L 25/167* (2013.01); *H01L 28/20* (2013.01); *H01L 28/40* (2013.01)

(58) Field of Classification Search
CPC ........ H01L 25/167; H01L 28/20; H01L 28/40

USPC ........................................................ 257/99
See application file for complete search history.

(56) References Cited

U.S. PATENT DOCUMENTS

| | | |
|---|---|---|
| 2014/0239870 A1 | 8/2014 | Nawa et al. |
| 2019/0207380 A1* | 7/2019 | Michaels ............. H05B 45/395 |

FOREIGN PATENT DOCUMENTS

| | | |
|---|---|---|
| JP | 2007-159230 A | 6/2007 |
| JP | 2013-110821 A | 6/2013 |

* cited by examiner

*Primary Examiner* — David S Blum
(74) *Attorney, Agent, or Firm* — Studebaker & Brackett PC

(57) ABSTRACT

A semiconductor module includes: a semiconductor package in which a semiconductor device is incorporated; a snubber circuit having a snubber capacitor and a snubber resistor which are connected in parallel to the semiconductor device; a first light-emitting device emitting light when residual voltage between an anode and a cathode of the semiconductor device becomes equal to or higher than first voltage; and a second light-emitting device emitting light when the residual voltage becomes equal to or higher than second voltage, wherein the first and second voltages are different from each other.

9 Claims, 6 Drawing Sheets

SEMICONDUCTOR MODULE

BACKGROUND OF THE INVENTION

Field

The present invention relates to a semiconductor module including a light emitting device for emitting light according to a residual voltage.

Background

Equipment using electricity operates by applying a voltage to energize a semiconductor switch. When it is necessary to directly adjust an electric circuit for maintenance, replacement of a semiconductor module or the like, it is essential to check the presence or absence of a residual voltage of the semiconductor module for safety reasons such as electric shock prevention. Conventionally, the presence or absence of the residual voltage has been checked via an external gauge such as an oscilloscope. However, when power supply is interrupted due to a power failure or the like and thus an external gauge cannot be used, it has been impossible to check the presence or absence of the residual voltage. On the other hand, there has been proposed a technique capable of checking the presence or absence of a residual voltage based on light emission of a light emitting device connected in parallel to a snubber capacitor when the voltage of the snubber capacitor has not been discharged (for example, see JP-2013-110821).

SUMMARY

However, in the prior art, it has been only possible to check whether the residual voltage is equal to or less than a predetermined value, and thus it has been impossible to check the level of the residual voltage.

Furthermore, in the prior art, the light emitting device is attached to a capacitor of a main circuit. However, the light emitting device is not attached to each semiconductor package in which one switching device and one diode are incorporated. Therefore, it has been impossible to check the presence or absence of a residual voltage in each semiconductor package.

The present invention has been made to solve the foregoing problems, and has a first object to provide a semiconductor module capable of checking not only the presence or absence of a residual voltage, but also the level of the residual voltage. Furthermore, the present invention has a second object to provide a semiconductor module capable of checking the presence or absence of a residual voltage for each semiconductor package in which one switching device and one diode are incorporated.

A semiconductor module according to the first invention includes: a semiconductor package in which a semiconductor device is incorporated; a snubber circuit having a snubber capacitor and a snubber resistor which are connected in parallel to the semiconductor device; a first light-emitting device emitting light when residual voltage between an anode and a cathode of the semiconductor device becomes equal to or higher than first voltage; and a second light-emitting device emitting light when the residual voltage becomes equal to or higher than second voltage, wherein the first and second voltages are different from each other.

A semiconductor module according to the second invention includes: a semiconductor package in which a semiconductor device is incorporated; a snubber circuit having a snubber capacitor and a snubber resistor which are connected in parallel to the semiconductor device; and a light-emitting device exposed from the semiconductor package and emitting light according to a residual voltage between an anode and a cathode of the semiconductor device, wherein the semiconductor device incorporated in the semiconductor package includes only one switching device and one diode connected in anti-parallel to the switching device.

In the first invention, two light emitting devices having different voltage values of the residual voltage causing light emission are provided. As a result, it is possible to check not only the presence or absence of the residual voltage, but also the level of the residual voltage.

In the second invention, the light emitting device is attached to each semiconductor package in which one switching device and one diode are incorporated and thus it is possible to check the presence or absence of a residual voltage for each semiconductor package.

Other and further objects, features and advantages of the invention will appear more fully from the following description.

DESCRIPTION OF EMBODIMENTS

A semiconductor module according to the embodiments of the present invention will be described with reference to the drawings. The same components will be denoted by the same symbols, and the repeated description thereof may be omitted.

First Embodiment

Figure 1:
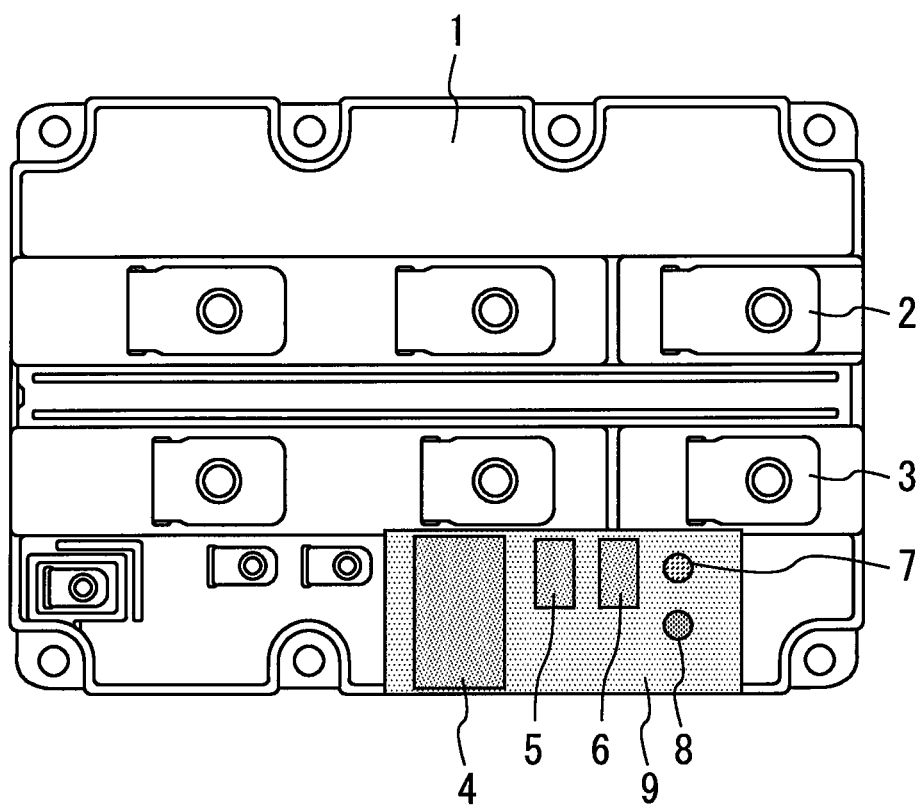
FIG. 1 is a plan view showing a semiconductor module according to a first embodiment.
Figure 2:
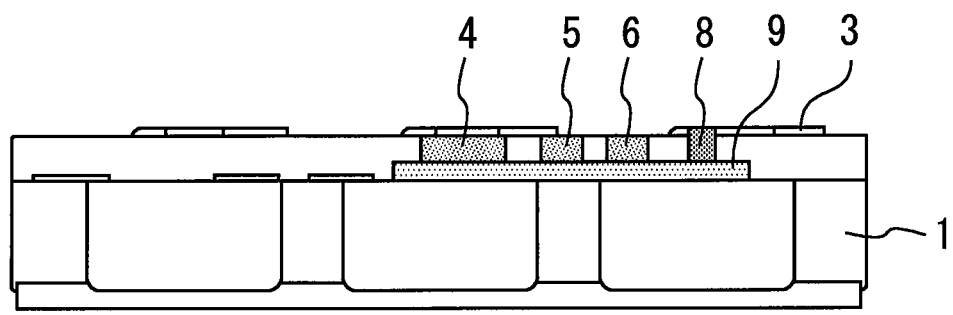
FIG. 2 is a side view showing the semiconductor module according to the first embodiment.

FIG. 1 is a plan view showing a semiconductor module according to a first embodiment. FIG. 2 is a side view showing the semiconductor module according to the first embodiment. A semiconductor package 1 has a plus (+) side electrode 2 and a minus (−) side electrode 3. A snubber capacitor 4, snubber resistors 5, 6, and first and second light emitting devices 7, 8 are mounted on a substrate 9. This substrate 9 is fitted to a semiconductor package 1.

Figure 3:
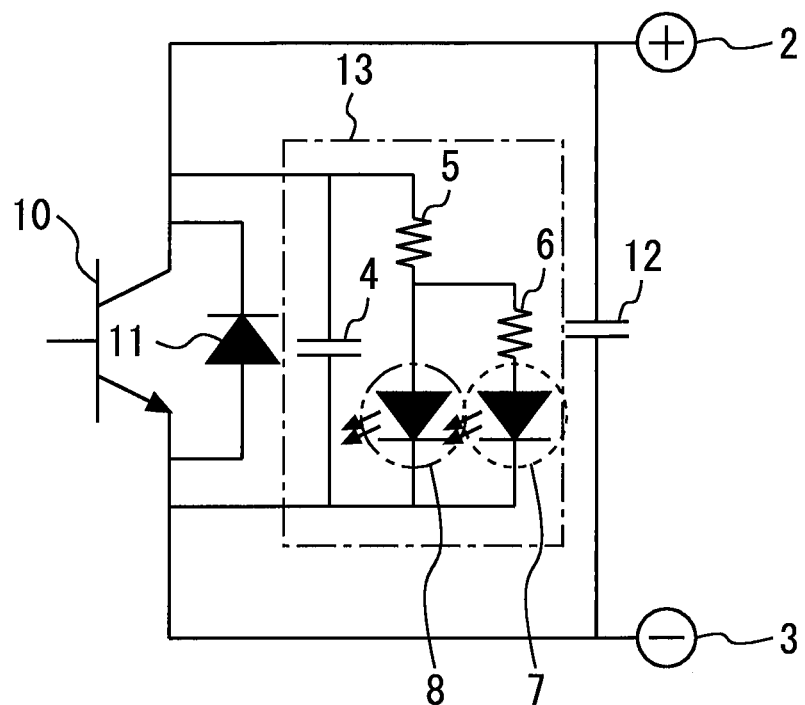
FIG. 3 is a circuit diagram showing the semiconductor module according to the first embodiment.

FIG. 3 is a circuit diagram showing the semiconductor module according to the first embodiment. The semiconductor package 1 contains, as semiconductor devices, one switching device 10, and one diode 11 connected in antiparallel to the switching device 1. An anode and a cathode of the switching device 10 are connected to the plus side electrode 2 and the minus side electrode 3, respectively. The switching device 10 is, for example, an IGBT or a MOSFET. A main capacitor 12 is connected in parallel to the switching device 10 and the diode 11 outside the semiconductor package 1.

The snubber capacitor 4 and the snubber resistors 5 and 6 are connected in parallel to the switching device 10 and the diode 11. A snubber circuit 13 has the snubber capacitor 4 and the snubber resistors 5, 6. The snubber resistor 5 has a resistance value of about 150 kΩ and the snubber resistor 6 has a resistance value of about 300 kΩ. The snubber capacitor 4 has a capacitance value at the nF level. The first light emitting device 7 is connected in series to the snubber resistors 5 and 6. The second light emitting device 8 is connected in series to the snubber resistor 5.

When a residual voltage exists between the anode and the cathode of the switching device 10, a voltage is charged in the snubber capacitor 4, and the first and second light-emitting devices 7 and 8 are energized according to the voltage value of the charged voltage to emit light. The first and second light-emitting devices 7 and 8 emit light when the residual voltage becomes equal to or higher than first and second voltages, respectively. The first and second voltages are different from each other. The first light emitting device 7 is a red LED for a high voltage, and the second light emitting device 8 is a blue LED for an intermediate voltage.

When the residual voltage is a high voltage equal to or higher than the first voltage, both the first and second light emitting devices 7 and 8 emit light. When the residual voltage is an intermediate voltage that is equal to or higher than the second voltage and also equal to or lower than the first voltage, only the second light emitting device 8 emits light. When the residual voltage is lower than the second voltage or when there is no residual voltage, both the light emitting devices 7 and 8 do not emit light. The semiconductor module according to the present embodiment has a state display function capable of checking these three states based on light emission patterns of the first and second light emitting devices 7 and 8.

The first voltage is set in a range from not less than 1000 V to less than 4500 V in consideration of the upper limit level of switching voltages of current semiconductor modules. The second voltage is set in a range from not less than 100 V to less than 1000 V. When the voltage value of the residual voltage is a low voltage less than 100 V, the voltage charged in the snubber capacitor is unlikely to cause a problem and thus it is unnecessary to finely check the level of the residual voltage.

Figure 4:
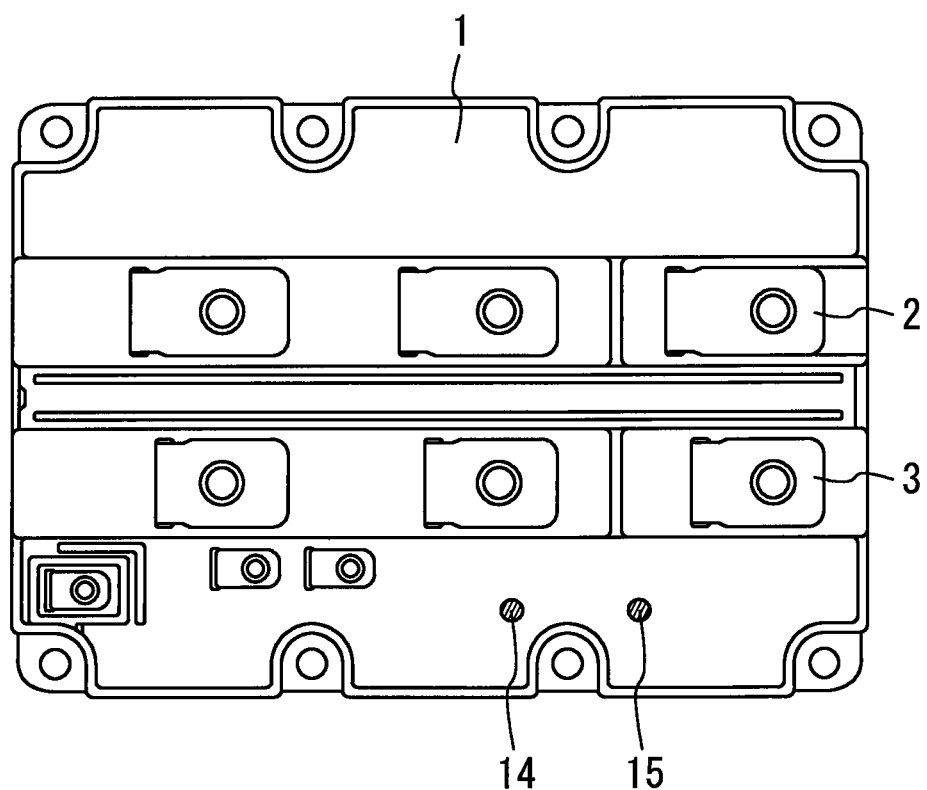
FIG. 4 shows a plan view showing a semiconductor package to which a substrate is not fitted.

FIG. 4 shows a plan view showing a semiconductor package to which a substrate is not fitted. External terminals 14 and 15 are drawn out to the surface of the semiconductor package 1. The external terminal 14 is connected to the anode of the switching device 10 via a wiring such as a copper bar or a wire inside the semiconductor package 1. Likewise, the external terminal 15 is connected to the cathode of the switching device 10.

Figure 5:
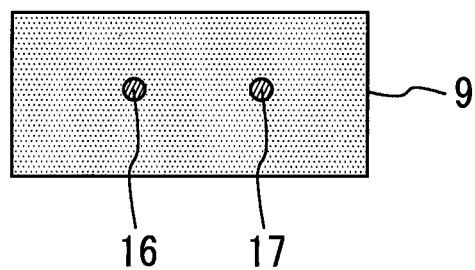
FIG. 5 is a view showing the lower surface of the substrate.

FIG. 5 is a view showing the lower surface of the substrate. Terminals 16 and 17 are provided on the lower surface of the substrate 9. The terminals 16 and 17 are connected to the snubber capacitor 4, the snubber resistors 5 and 6, and the first and second light emitting devices 7 and 8. The terminals 16 and 17 of the substrate 9 are respectively connected and fixed to the external terminals 14 and 15 by soldering or the like. As a result, the snubber circuit 13 and the first and second light emitting devices 7, 8 are connected in parallel to the switching device 10 and the diode 11.

As described above, in the present embodiment, two light emitting devices having different voltage values of the residual voltage causing light emission are provided. As a result, it is possible to check not only the presence or absence of the residual voltage, but also the level of the residual voltage.

Second Embodiment

Figure 6:
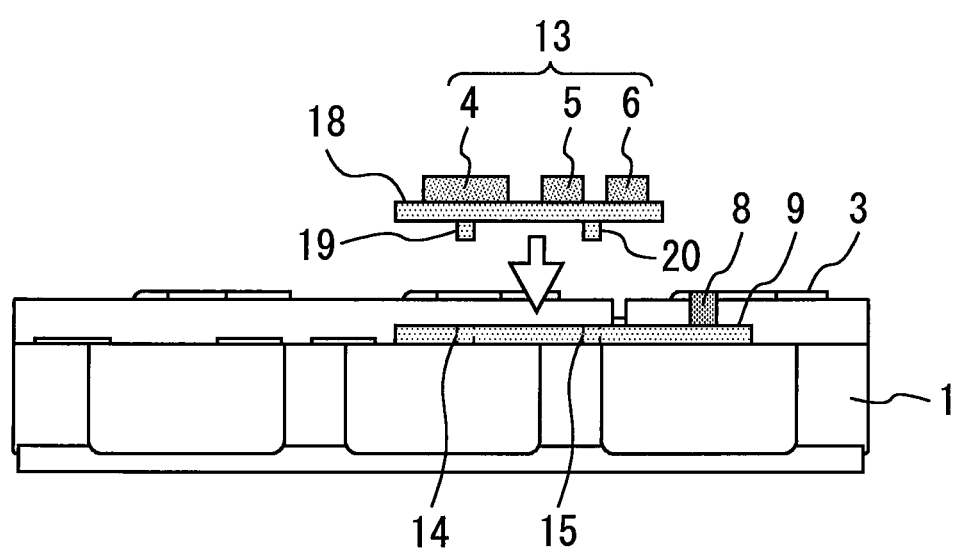
FIG. 6 is a side view showing a semiconductor module according to a second embodiment.

FIG. 6 is a side view showing a semiconductor module according to a second embodiment. The snubber circuit 13 is mounted on a substrate 18, and is connected to terminals 19 and 20 on the back surface of the substrate 18. The terminals 19, 20 of the substrate 18 and the external terminals 14, 15 are configured to be connectable to each other in plug-in style. Accordingly, the snubber circuit 13 is configured to be detachable from the semiconductor package 1. As a result, the state display function can be made effective by attaching the snubber circuit 13 to the semiconductor package 1 as required. Furthermore, the snubber circuit 13 can be easily optimized by manufacturing the substrate 18 on which the snubber circuit 13 having an optimum snubber constant is mounted. The other configurations and effects are the same as those in the first embodiment.

Third Embodiment

Figure 7:
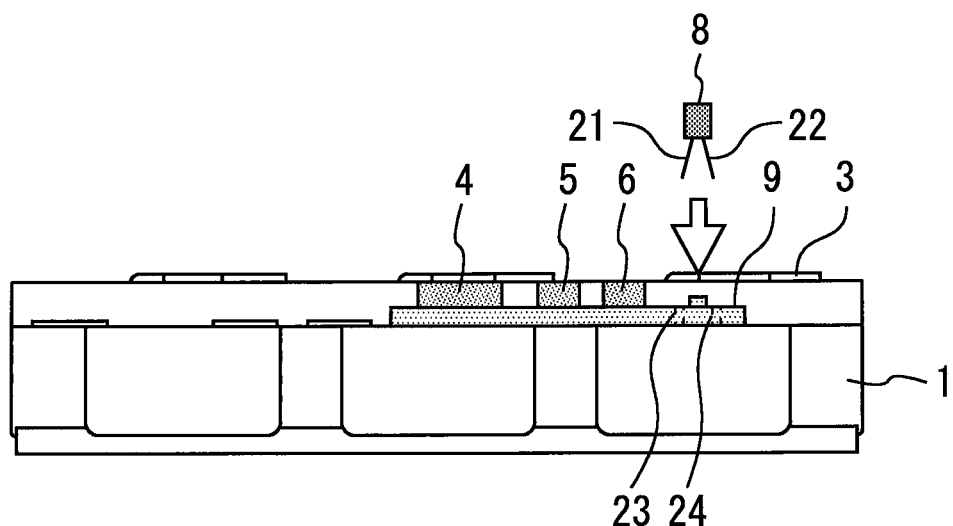
FIG. 7 is a side view showing a semiconductor module according to a third embodiment.

FIG. 7 is a side view showing a semiconductor module according to a third embodiment. Pins 21 and 22 of the second light emitting device 8 can be connected to connectors 23 and 24 of the substrate 9 by inserting the pins 21 and 23 into the connectors 23 and 24. The same is applied to the first light-emitting device 7. Accordingly, the first and second light-emitting devices 7 and 8 are configured to be detachable from the semiconductor package 1. As a result, the state display function can be made effective by attaching the first and second light emitting devices 7 and 8 as required. Note that only LED for a high voltage or only LED for an intermediate voltage can operate alone, and only one of the first and second light-emitting devices 7 and 8 may be attached at a required place according to an application. The other configurations and effects are the same as those in the first embodiment.

Fourth Embodiment

Figure 8:
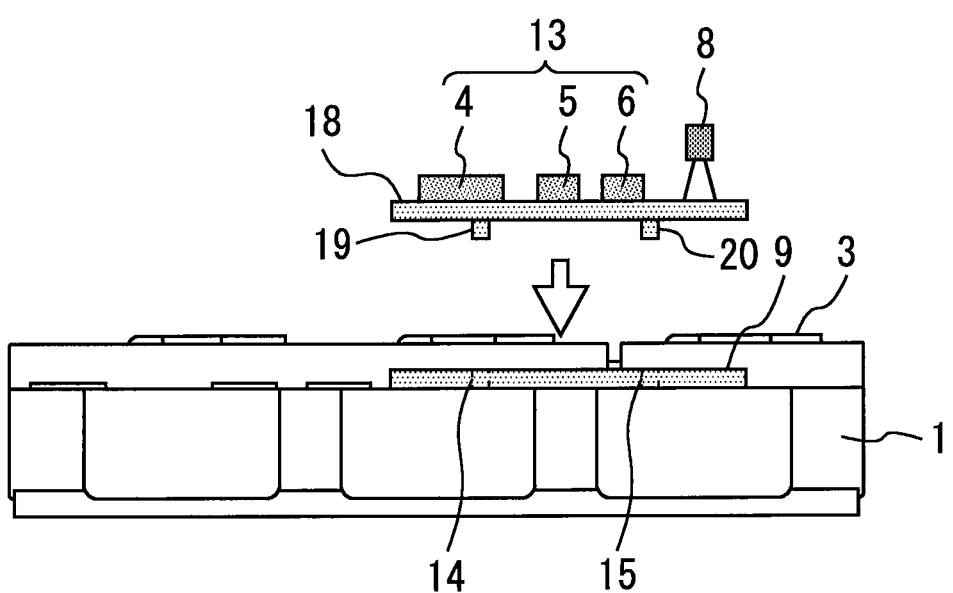
FIG. 8 is a side view showing a semiconductor module according to a fourth embodiment.

FIG. 8 is a side view showing a semiconductor module according to a fourth embodiment. The snubber circuit 13 and the first and second light emitting devices 7 and 8 are mounted on the substrate 18. The snubber circuit 13 and the first and second light emitting devices 7 and 8 are connected to the terminals 19 and 20 on the back surface of the substrate 18. The terminals 19, 20 of the substrate 18 and the external terminals 14, 15 are connectable to each other in a plug-in style. Accordingly, the substrate 18 on which the snubber circuit 13 and the first and second light emitting devices 7 and 8 are integrated with each other is detachable from the semiconductor package 1. As a result, the state display function can be made effective by attaching the substrate 18 as required. The other configurations and effects are the same as those in the first embodiment.

Fifth Embodiment

Figure 9:
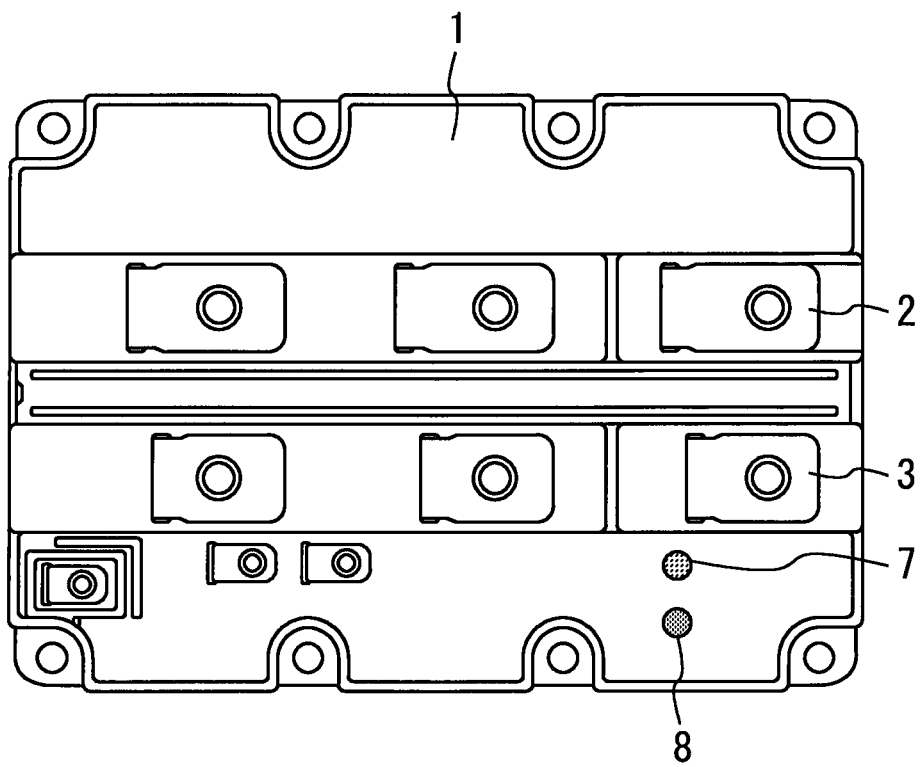
FIG. 9 is a plan view showing a semiconductor module according to a fifth embodiment.
Figure 10:
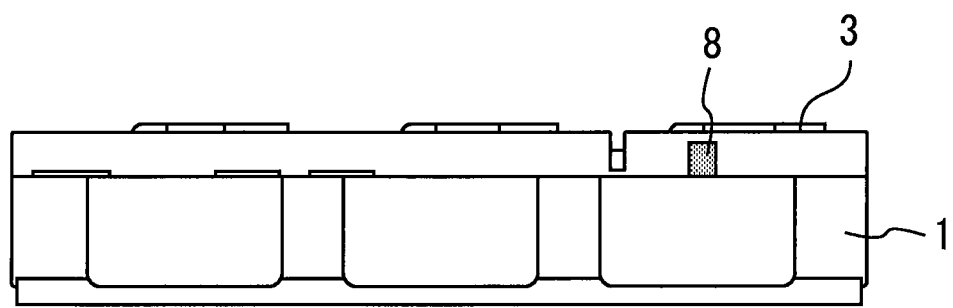
FIG. 10 is a side view showing the semiconductor module according to the fifth embodiment.

FIG. 9 is a plan view showing a semiconductor module according to a fifth embodiment. FIG. 10 is a side view showing the semiconductor module according to the fifth embodiment. The snubber circuit 13 and the first and second light emitting devices 7 and 8 are incorporated in the semiconductor package 1. Only light emitting portions of the first and second light emitting devices 7, 8 are exposed from the semiconductor package 1, and display the residual voltage. As a result, the circuit portion is protected and not exposed to the outside air, so that the possibility of short-circuiting of the circuit caused by an external factor is reduced. The other configurations and effects are the same as those in the first embodiment.

Sixth Embodiment

Figure 11:
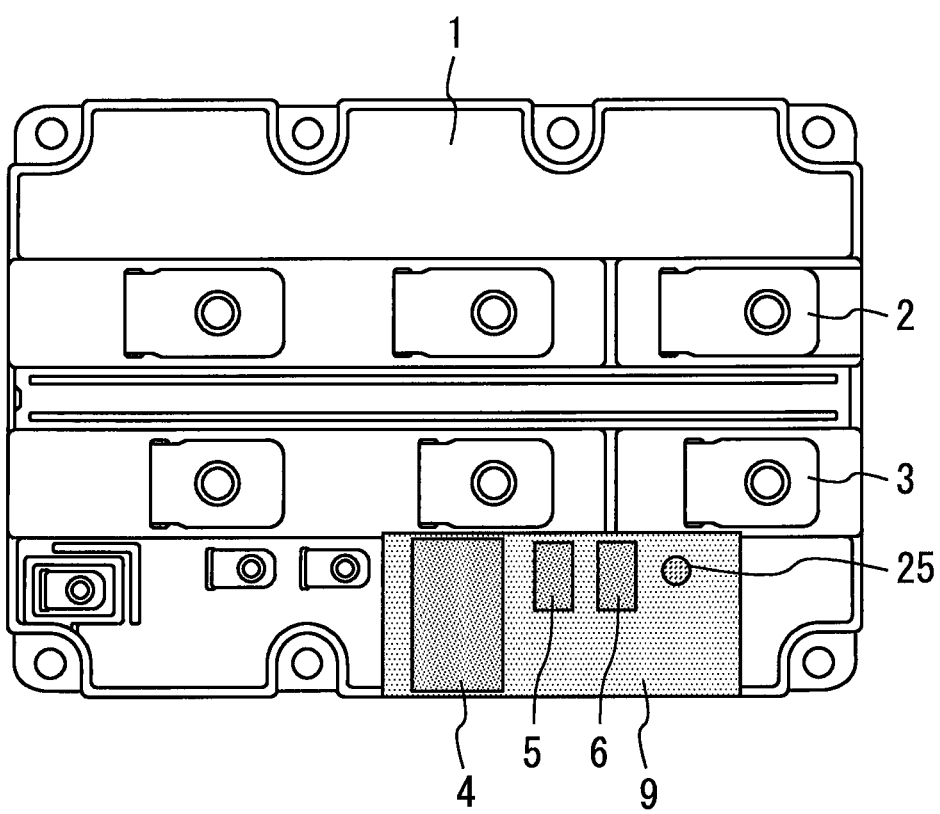
FIG. 11 is a plan view showing a semiconductor module according to a sixth embodiment.

FIG. 11 is a plan view showing a semiconductor module according to a sixth embodiment. In the first to fifth embodiments, the first and second light emitting devices 7 and 8 are provided, but in the present embodiment, only one light emitting device 25 is provided. Since the light emitting device 25 is attached to each semiconductor package 1 in which one switching device 10 and one diode 11 are incorporated, it is possible to check the presence or absence of a residual voltage for each semiconductor package 1. Furthermore, since there is only one light emitting device, the external shape can be made compact. The other configurations and effects are the same as those in the first embodiment.

The switching device 10 and the diode 11 are not limited to semiconductor devices made of silicon, but instead may be made of a wide-bandgap semiconductor having a bandgap wider than that of silicon. The wide-bandgap semiconductor is, for example, a silicon carbide, a gallium-nitride-based material, or diamond. A semiconductor device made of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved. Both the switching device 10 and the diode 11 are desirably made of a wide-bandgap semiconductor. However, only one of them may be made of a wide-bandgap semiconductor. Thus it is possible to obtain the effects described in this embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-157719, filed on Aug. 24, 2018 including specification, claims, drawings and summary, on which the Convention priority of the present application is based, is incorporated herein by reference in its entirety.

The invention claimed is:

1. A semiconductor module comprising:
a semiconductor package in which a semiconductor device is incorporated;
a snubber circuit having a snubber capacitor and a snubber resistor which are connected in parallel to the semiconductor device;
a first light-emitting device emitting light when residual voltage between an anode and a cathode of the semiconductor device becomes equal to or higher than first voltage; and
a second light-emitting device emitting light when the residual voltage becomes equal to or higher than second voltage,
wherein the first and second voltages are different from each other.

2. The semiconductor module according to claim 1, wherein the first voltage is set in a range from not less than 1000 V to less than 4500 V, and
the second voltage is set in a range from not less than 100 V to less than 1000 V.

3. The semiconductor module according to claim 1, wherein the snubber circuit is configured to be detachable from the semiconductor package.

4. The semiconductor module according to claim 1, wherein at least one of the first and second light-emitting devices is configured to be detachable from the semiconductor package.

5. The semiconductor module according to claim 1, further comprising a substrate on which the snubber circuit and the first and second light emitting devices are mounted,
wherein the substrate is configured to be detachable from the semiconductor package.

6. The semiconductor module according to claim 1, wherein the snubber circuit and the first and second light emitting devices are incorporated in the semiconductor package, and
light emitting portions of the first and second light emitting devices are exposed from the semiconductor package.

7. The semiconductor module according to claim 1, wherein the semiconductor device is made of a wide-bandgap semiconductor.

8. A semiconductor module comprising:
a semiconductor package in which a semiconductor device is incorporated;
a snubber circuit having a snubber capacitor and a snubber resistor which are connected in parallel to the semiconductor device; and
a light-emitting device exposed from the semiconductor package and emitting light according to a residual voltage between an anode and a cathode of the semiconductor device,
wherein the semiconductor device incorporated in the semiconductor package includes only one switching device and one diode connected in anti-parallel to the switching device.

9. The semiconductor module according to claim 8, wherein the semiconductor device is made of a wide-bandgap semiconductor.

* * * * *